United States Patent
Plants

(10) Patent No.: US 10,007,573 B2
(45) Date of Patent: Jun. 26, 2018

(54) PREFERRED STATE ENCODING IN NON-VOLATILE MEMORIES

(71) Applicant: Invensas Corporation, San Jose, CA (US)

(72) Inventor: William C. Plants, Campbell, CA (US)

(73) Assignee: Invensas Corporation, San Jose, CA (US)

( * ) Notice: Subject to any disclaimer, the term of this patent is extended or adjusted under 35 U.S.C. 154(b) by 0 days. days.

(21) Appl. No.: 14/876,069

(22) Filed: Oct. 6, 2015

(65) Prior Publication Data

US 2016/0314042 A1    Oct. 27, 2016

Related U.S. Application Data

(60) Provisional application No. 62/153,342, filed on Apr. 27, 2015.

(51) Int. Cl.
| | | |
|---|---|---|
| *G11C 29/00* | (2006.01) | |
| *G06F 11/10* | (2006.01) | |
| *G06F 3/06* | (2006.01) | |
| *G11C 29/52* | (2006.01) | |
| *G11C 29/04* | (2006.01) | |

(52) U.S. Cl.
CPC ......... *G06F 11/1068* (2013.01); *G06F 3/064* (2013.01); *G06F 3/0619* (2013.01); *G06F 3/0656* (2013.01); *G06F 3/0679* (2013.01); *G11C 29/52* (2013.01); *G11C 2029/0411* (2013.01)

(58) Field of Classification Search
CPC .. G06F 11/1068; G06F 3/0619; G06F 3/0656; G06F 3/0679; G06F 3/064; G06F 11/1008; G06F 12/0238; G06F 2212/202; G06F 11/1072; G06F 11/1012; G11C 29/52; G11C 2029/0411; G11C 16/10; G11C 16/0483; G11C 11/5628; H03M 13/2906; H03M 13/356
See application file for complete search history.

(56) References Cited

U.S. PATENT DOCUMENTS

| | | |
|---|---|---|
| 7,518,922 B2 | 4/2009 | Maejima et al. |
| 7,525,864 B2 | 4/2009 | Brown |

(Continued)

OTHER PUBLICATIONS

Cooke, Jim, "The Inconvenient Truths of NAND Flash Memory," Flash Memory Summit, Micron Technology, Inc., Santa Clara, CA, Aug. 2007, 32 pages.

(Continued)

*Primary Examiner* — Guerrier Merant

(57) ABSTRACT

The invention pertains to non-volatile memory devices, and more particularly to advantageously encoding data in non-volatile devices in a flexible manner by both NVM manufacturers and NVM users. Multiple methods of preferred state encoding (PSE) and/or error correction code (ECC) encoding may be used in different pages or blocks in the same NVM device for different purposes which may be dependent on the nature of the data to be stored.

25 Claims, 15 Drawing Sheets

(56) References Cited

U.S. PATENT DOCUMENTS

| | | | |
|---|---|---|---|
| 7,840,878 B1* | 11/2010 | Tang | H03M 13/09 |
| | | | 714/755 |
| 7,990,796 B2 | 8/2011 | Brown | |
| 8,014,196 B2 | 9/2011 | Graef | |
| 8,289,768 B2 | 10/2012 | Warren et al. | |
| 8,321,760 B2* | 11/2012 | Son | G06F 11/1072 |
| | | | 711/103 |
| 8,560,918 B1 | 10/2013 | Yang | |
| 8,756,464 B2 | 6/2014 | Kim et al. | |
| 9,007,866 B2 | 4/2015 | Fisch et al. | |
| 2010/0241928 A1* | 9/2010 | Kim | G06F 11/1012 |
| | | | 714/763 |
| 2011/0125975 A1* | 5/2011 | Kim | G06F 12/0607 |
| | | | 711/157 |
| 2011/0239081 A1* | 9/2011 | Hida | G06F 11/1012 |
| | | | 714/755 |
| 2012/0096332 A1* | 4/2012 | Furno | G06F 11/1068 |
| | | | 714/773 |
| 2015/0006791 A1* | 1/2015 | Yoo | G11C 16/10 |
| | | | 711/103 |
| 2016/0350177 A1* | 12/2016 | Kanno | G06F 11/1008 |

OTHER PUBLICATIONS

Hynix, "4 Gbit (512 M x 8 bit) NAND Flash Memory," Rev. 1.4, SK Hynix Inc., Oct. 8, 2010, 62 pages.

Intel et al., "Open NAND Flash Interface Specification," ONFI (Open NAND Flash Interface) Workgroup, Rev. 4.0, Apr. 2, 2014, 315 pages.

JEDEC Standard, "DDR4 SDRAM, JESD79-4," JEDEC (Joint Electron Device Engineering Council), JEDEC Solid State Technology Association, Arlington, VA, Sep. 2012, 213 pages.

Macronix, "Improving NAND Throughput with Two-Plane and Cache Operations," Technical Note, Macronix International Co., Ltd., Rev. 1, Nov. 15, 2013, 13 pages.

Mariano, Marina, "ECC Options for Improving NAND Flash Memory Reliability," Software Spotlight, Micron Technologies, Inc., Rev. C, Jan. 2012, 15 pages.

Micron, "NAND Flash 101: An Introduction to NAND Flash and How to Design It in to Your Next Product," Technical Note, Micron Technology, Inc., TN-29-19, Rev. B, Apr. 2010, 27 pages.

Wallace, Hank, "Error Detection and Correction Using the BCH Code," white paper, © 2001, 21 pages.

* cited by examiner

| Bit Error | Binary BCH | | | |
|---|---|---|---|---|
| | Overhead per 512 Byte Sector | | Spare Area Usage per 2,048 Byte Page | |
| | Bit | Byte | 64 Bytes | 112 Bytes |
| 1 | 13 | 2 | 13% | 7% |
| 2 | 26 | 4 | 25% | 14% |
| 4 | 52 | 7 | 44% | 25% |
| 8 | 104 | 13 | 81% | 46% |
| 10 | 130 | 17 | 106% | 61% |
| 14 | 182 | 23 | 144% | 82% |

Figure 2A
(Related Art)

| Line # | Min Byte Address | Max Byte Address | Number of Bytes | ECC Protected? | Area | Description |
|---|---|---|---|---|---|---|
| 236 | 0 | 2,047 | 2,048 | Yes | Main | User Data |
| 238 | 2,048 | 2,079 | 32 | Yes | Spare | ECC Overhead for Main and Spare |
| 240 | 2,080 | 2,095 | 16 | Yes | Spare | User Metadata 1 |
| 242 | 2,096 | 2,103 | 8 | No | Spare | User Metadata 2 |
| 244 | 2,104 | 2,107 | 4 | No | Spare | Factory Metadata |
| 246 | 2,108 | 2,111 | 4 | No | Spare | Reserved |

| Initial Data | | | | SUM[D<3:0>] | E<4>=Invert | Encoded Data | | | | SUM[E<4:0>] | Ratio |
| --- | --- | --- | --- | --- | --- | --- | --- | --- | --- | --- | --- |
| D<3> | D<2> | D<1> | D<0> | | | E<3> | E<2> | E<1> | E<0> | | |
| 1 | 1 | 1 | 1 | 4 | 1 | 0 | 0 | 0 | 0 | 1 | |
| 1 | 1 | 1 | 0 | 3 | 1 | 0 | 0 | 0 | 1 | 2 | |
| 1 | 1 | 0 | 1 | 3 | 1 | 0 | 0 | 1 | 0 | 2 | |
| 1 | 1 | 0 | 0 | 2 | 0 | 1 | 1 | 0 | 0 | 2 | |
| 1 | 0 | 1 | 1 | 3 | 1 | 0 | 1 | 0 | 0 | 2 | |
| 1 | 0 | 1 | 0 | 2 | 0 | 1 | 0 | 1 | 0 | 2 | |
| 1 | 0 | 0 | 1 | 2 | 0 | 1 | 0 | 0 | 1 | 2 | |
| 1 | 0 | 0 | 0 | 1 | 0 | 1 | 0 | 0 | 0 | 1 | |
| 0 | 1 | 1 | 1 | 3 | 1 | 1 | 0 | 0 | 0 | 2 | |
| 0 | 1 | 1 | 0 | 2 | 0 | 0 | 1 | 1 | 0 | 2 | |
| 0 | 1 | 0 | 1 | 2 | 0 | 0 | 1 | 0 | 1 | 2 | |
| 0 | 1 | 0 | 0 | 1 | 0 | 0 | 1 | 0 | 0 | 1 | |
| 0 | 0 | 1 | 1 | 2 | 0 | 0 | 0 | 1 | 1 | 2 | |
| 0 | 0 | 1 | 0 | 1 | 0 | 0 | 0 | 1 | 0 | 1 | |
| 0 | 0 | 0 | 1 | 1 | 0 | 0 | 0 | 0 | 1 | 1 | |
| 0 | 0 | 0 | 0 | 0 | 0 | 0 | 0 | 0 | 0 | 0 | |
| Average: | | | | 2.00 | | | | | Average: | 1.56 | 0.78 |

| Data Bits | Ratio of Preferred State Data to Normal Data | Percent Decrease in Preferred State Bits | Area Increase |
|---|---|---|---|
| 4 | 0.781 | 21.9% | 25.0% |
| 8 | 0.817 | 18.3% | 12.5% |
| 16 | 0.854 | 14.6% | 6.3% |
| 32 | 0.887 | 11.3% | 3.1% |
| 64 | 0.915 | 8.5% | 1.6% |
| 128 | 0.937 | 6.3% | 0.8% |

Figure 4
(Related Art)

| Reference # | Min Byte Address | Max Byte Address | Number of Bytes | ECC Protected? | Area | Description |
|---|---|---|---|---|---|---|
| 616 | 0 | 2,047 | 2,048 | Yes | Main | User Data |
| 618 | 2,048 | 2,078 | 31 | Yes | Spare | ECC Overhead for Main and Spare |
| 620 | 2,079 | 2,079 | 1 | Yes | Spare | PSE Value Byte |
| 622 | 2,080 | 2,111 | 32 | Yes | Spare | PSE Overhead Bits |

2 KB Main, 64 B Spare, 4-bit BCH ECC, 64-bit PSE Word

| Reference # | Min Byte Address | Max Byte Address | Number of Bytes | ECC Protected? | Area | Description |
|---|---|---|---|---|---|---|
| 646 | 0 | 2,047 | 2,048 | Yes | Main | User Data |
| 648 | 2,048 | 2,079 | 32 | Yes | Spare | ECC Overhead for Main and Spare |
| 650 | 2,080 | 2,143 | 64 | Yes | Spare | PSE Overhead Bits |
| 652 | 2,144 | 2,151 | 8 | Yes | Spare | User Metadata1 |
| 654 | 2,152 | 2,155 | 4 | No | Spare | User Metadata2 |
| 656 | 2,156 | 2,159 | 4 | No | Spare | Factory Metadata |

2 KB Main, 112 B Spare, 4-bit BCH ECC, 32-bit PSE Word, 4 B Factory Metadata

Figure 6B

PREFERRED STATE ENCODING IN NON-VOLATILE MEMORIES

RELATED APPLICATIONS

This application claims priority to U.S. provisional patent application 62/153,342 filed on Apr. 27, 2015 which is hereby included by reference herein in its entirety.

FIELD OF THE INVENTION

The invention pertains to non-volatile memories, and more particularly to advantageously encoding data in non-volatile memories.

BACKGROUND OF THE INVENTION

Many types of non-volatile memories (NVM) are known in the art: EPROM, EEPROM, Flash (floating gate, SONOS, etc.), MRAM, and ReRAM amongst others. In general, flash memory is the most common commercially available type of NVM. Typically, the memory cells in these devices are a single transistor with either a floating (e.g., polysilicon) or charge-trapping (e.g., SONOS) gate fabricated between the control gate and the conduction channel. The amount of charge stored between the control gate and the channel determines the threshold voltage ($V_t$) of the transistor. In general, $V_t$ (sometimes called the turn-on voltage) is the gate-to-source voltage where the transistor changes from operating in the subthreshold mode (partially on, i.e., somewhat conductive) to operating in the inversion mode (fully on, i.e., highly conductive). By setting $V_t$ to different levels controlling the degree of conduction, one or more bits of data can be stored in the memory cell by changing the current at predetermined gate voltages.

NAND flash memory is the most common type of Flash NVM commercially available, being present in most cameras, cellphones, tablets, universal serial bus (USB) drives, and solid-state drives (SSD) to name a few. The demand for more and cheaper memory in these devices is a major driver of semiconductor technology, pushing NVM manufacturers towards ever finer geometries and the storage of more bits per memory cell to increase the density.

Unfortunately, this trend has a negative impact on the memory cells. Smaller geometries and the accompanying stochastic variations make the cells more delicate than in earlier generations, making them more vulnerable to program and read disturbs (e.g., loss of data), stress and wear from program and erase operations (e.g., data retention and endurance issues), and physical damage to the memory cells (e.g., charge trapping in gate oxides, increased leakage current in memory cells and bit lines, and possibly complete failure of a cell). The trend towards two or three bits per cell exacerbates the situation by attempting to sense smaller $V_t$ differences in each memory cell.

FIG. 1A shows a conventional NAND flash memory integrated circuit 100. Integrated circuit 100 comprises a memory array 102 which contains the non-volatile memory cells. Memory array 102 is divided into one or more planes 104. A plane 104 is typically comprised of a plurality of blocks 106 each of which further comprises a plurality of pages 108. A page 108 is typically the smallest unit of the array which can be read or programmed in a single operation while a block is typically the smallest erasable unit in both plane 104 and memory array 102. When multiple planes 104 are present in integrated circuit 100, they are typically used to simplify multiple simultaneous operations. In some NAND memory integrated circuits, an even larger unit called a Logical Unit (not shown in FIG. 1A) can be present comprising multiple planes 104 as described in the *Open NAND Flash Interface Specification*, revision 4.0, by the ONFI Workgroup, Apr. 2, 2014, page 67. The entire Section 3 entitled Memory Organization on pages 67 to 80 of the ONFI specification contains a good introduction to the topic of array architecture and the entire ONFI 4.0 Specification is hereby included by reference herein in its entirety.

NAND flash memory integrated circuit 100 also comprises other circuitry. Each plane 104 will have one or more page buffers 110 associated with it. Current commercial NAND flash offerings often have two: one called the page buffer (or page register) and the other called the cache buffer (or cache register) to allow two simultaneous operations either within a plane (or chip if there is only one plane) or between planes. Each page buffer 110 is divided into a main area 112 and a spare area 114 (illustrated as separated with a dashed line). Each page 108 is also divided into a main area 116 and a spare area 118 (also illustrated as separated with a dashed line). The page buffer 110, its main area 112 and its spare area 114 typically contain substantially the same number of bits as contained in page 108, main area 116 and spare area 118 respectively. This allows the page buffer to be conveniently used as a staging area for either program or read operations. Thus data can be prepared for writing from the page buffer 110 to a page 108 in the memory array 102 during a program operation, or it can be prepared being read from page buffer 110 to external circuitry outside of integrated circuit 100 by means of multiplexer 120 and Data I/O Interface 122 during a read operation. Multiplexer 120 selects between the targeted plane 104 and any non-targeted planes, if any. Data I/O Interface 122 comprises the input and output buffers that allow integrated circuit 100 to communicate data to and from external circuitry. Details of the use of page and cache buffers as well as multiple planes can be found in the application note *Improving NAND Throughput with Two-Plane and Cache Operations*, Micronix International, AN0268, Rev. 1, Nov. 15, 2013, and is hereby included by reference herein in its entirety.

NAND flash memory integrated circuit 100 further comprises control logic 124 and control I/O interface 126. Control logic 124 is typically coupled to most of the internal circuitry with hundreds or thousands of signal lines (not shown in FIG. 1A) and typically comprises a large and complex state machine implemented in ASIC-type standard cells. Instructions to control logic 124 are input through input buffers in control I/O interface 126 and status information is output through output buffers also contained in control I/O interface 126.

Sometimes present are special one-time programmable (OTP) blocks internal to memory array 102 that can be used by either the manufacturer or the end user like, for example, user OTP block 128 and factory OTP block 130. These can be used for a variety of purposes including storing serial numbers, design revisions, process and analog calibration information, and design data. Once programmed these blocks can be locked to prevent tampering with the OTP data.

NAND flash memory integrated circuit 100 further comprises error correction code (ECC) circuit 131 which is capable of encoding external write data in page buffer 110 for programming into a selected page 108 of array 102. ECC circuit 131 is also capable of decoding data read from page 108 into the page buffer 110 to detect and correct any errors that may have occurred since page 108 was programmed. The ECC code implemented is chosen by the manufacturer of integrated circuit 100.

Many other circuits (and thousands of related signal lines) are present in integrated circuit 100, but are not shown in FIG. 1A to avoid overly complicating the diagram. In addition to the usual memory access circuits like row and column address decoders, sense amplifiers, and the like, there are typically many analog circuits such as band gap references, operational amplifiers, digital-to-analog and analog-to-digital converters, and charge pumps present that control logic 124 uses to provide the needed voltages to memory array 102 to allow read, program (write), and erase operations.

FIG. 1B illustrates a NAND string 132 suitable for use in NAND memory integrated circuit 100. NAND string 132 comprises a series connection of N non-volatile transistors 134-0 through 134-(N−1)—where N is an integer. At each end of the string are access transistors 136 and 138. Typically N is a power of two like, for example, 32, 64 or 128, but it need not be. For example, a two-bit per cell NAND device might use one-bit per cell on the two outermost devices in a string, for reliability reasons since device mismatches are typically greater at an array edge. Thus to store 128 bits the string would require N=66 (e.g., 62*2 bits+4*1 bit=128 bits and thus N=62 devices+4 devices=66 devices).

Sometimes one or more dummy cells (physically present for process matching but not used to store data) are placed at the ends of the string between non-volatile transistor 134-0 and access transistor 136 and non-volatile transistor 134-(N−1) and access transistor 138. These dummy cells are not shown in FIG. 1B to avoid overly complicating the diagram.

Coupled to the gate of each of the non-volatile transistors 134-0 through 134-(N−1) are word lines 140-0 through 140-(N−1) respectively. These are used to address individual rows of non-volatile transistors 134-i across at least a portion of memory array 102. Running parallel to the word lines 140-0 through 140-(N−1) are select lines 142 and 144 as well as source line 146. Select lines 142 and 144 are coupled to the gates of access transistors 136 and 138 respectively and are used to access NAND string 132 for program and read operations by means of source line 146 and bit line 148. Bit line 148 runs perpendicular to word lines 140-0 through 140-(N−1), select lines 142 and 144 and source line 146.

FIG. 1C is a block diagram illustrating more details of an exemplary block 106 from a plane 104 in memory array 102. Block 106 comprises a plurality of NAND strings 132 arranged in rows and columns. The NAND strings 132 in a column are coupled together by sharing a single bit line 148 and each column of NAND strings 132 has its own bit line 148. All of the bit lines 148 are coupled to block read/program circuit 150 which contains the sense amplifiers, write drivers, column selectors and various other circuits which are well known in the art and will not be discussed to avoid unnecessarily complicating the disclosure. Further information can be found in the Micron Technology Technical Note TN-29-19, *NAND Flash 101: An Introduction to NAND Flash and How to Design It In to Your Next Product*, Rev. B, April 2010, which is hereby included by reference herein in its entirety.

Each row of NAND strings 132 are coupled together by all of the horizontal lines detailed in the discussion of FIG. 1B above. Thus each row shares word lines 140-0 through 140-(N−1)—which are combined together as the bus 140-[N−1:0] in the figure—as well as select lines 142 and 144 and source line 146. Various other circuits such as block select logic, row decoders, etc., which are well known in the art are not shown in FIG. 1C to avoid over complication.

Typically, an entire page 108 is stored in a single row of non-volatile transistors 134. Thus N pages 108 are stored in each row of NAND strings 132. Addressing a particular page 108 requires accessing a particular instance of rows of NAND strings 132 by means of select lines 142 and 144 and then choosing the correct word line from word line bus 140[N−1:0] for the desired page. The block 106 includes both main area 116 and spare area 118 (illustrated as separated with a dashed line) as previously discussed in conjunction with FIG. 1A

As geometries shrink, error correction coding (ECC) of increasing strength is typically used to mitigate the various problems associated with the smaller transistors. Redundant information in the form of additional bits (ECC overhead bits) is added to the data to allow reconstruction of the original data in the case of errors. There is a trade-off between the number of bad bits the ECC can correct and the amount of additional ECC overhead bits added.

Many different ECC codes have been used in NAND flash memories (e.g., Hamming codes, Reed-Solomon codes, and Bose-Chaudhuri-Hocquenghem (BCH) codes), though the current trend appears to be towards using BCH codes due to their higher efficiency relative to Reed-Solomon codes and ability to correct an arbitrarily large number of incorrect bits with predictable overhead. A good introduction to the subject can be found in a Micron Technology white paper entitled *ECC Options for Improving NAND Flash Memory Reliability*, Rev. C, January 2012, by Marina Mariano (henceforth Mariano), hereby included by reference herein in its entirety.

BCH codes are linear block codes and can be systematically encoded. For a linear code the encoding and decoding can be calculated using binary polynomials and linear algebra. A block code comprises code words of equal length. Systematic encoding means that a resulting code word can be arranged so that the original data word can be recognized in the encoded word. This allows any characteristics of the original data to be used in other advantageous ways while retaining the benefits of using error correction. A further discussion on the characteristics of BHC codes can be found in *Error Detection and Correction Using the BCH Code*, Hank Wallace, Atlantic Quality Design, Inc., 2001, which is hereby included by reference herein in its entirety.

Table 200 in FIG. 2 shows some exemplary data from Mariano showing some of the tradeoffs in using BCH codes of varying degrees of strength (i.e., how many single-bit errors can be corrected in a data word). In general, the stronger the code the greater the cost in additional ECC overhead bits.

As discussed above, NAND flash memory devices typically have their memory arrays separated into two parts: a data area comprising a number of bytes of user data (typically 512, 2048 or 4096 bytes in a page) and a spare area for containing information including such management data such as the ECC overhead bits, program and erase history to enable wear leveling, bad block data if a failure occurs, user metadata, etc.

The data in table 200 assumes that a page is 2,048 bytes with a spare area of either 64 bytes or 112 bytes for a total of 2,112 or 2,160 bites per page respectively, though other values can be used. The ECC encoding is assumed to be implemented in 512 byte sectors (i.e., four sectors per page).

In table 200, column 202 indicates the number of bits to be corrected in each 512 byte sector, column 204 shows the BCH code overhead in ECC bits for that sector, and column 206 shows the number of bytes needed to contain that number of ECC bits. Columns 208 and 210 show the percentage of 64-byte and a 112-byte spare areas, respectively, used by the needed ECC bits for all four sectors. For example, if four-bit ECC is desired the overhead is 52 bits per sector which can be packed into 7 bytes (with four bits unused). Since there are four sectors per page, a total of 28 bytes is required in the spare area. This amounts to 44% of a 64-byte spare area and 25% of a 112-byte spare area. A usage greater than 100% in either column 108 or column 110 means the combination of that bit error correction strength and that spare area size cannot be implemented in the available hardware. For example, using 10-bit ECC would require 17 bytes per sector requiring a total of 68 bytes per page which cannot be accommodated in a 64 byte spare area but would fit in a 112 byte spare area.

Table 220 in FIG. 2B illustrates an exemplary address map of page 108 comprising a main area of 2,048 bytes (=2 kilo-bytes or 2 KB) and a spare area of 64 bytes. Each row shows the relevant data for a particular field. For example, by far the largest field is the User Data shown in line 236 since it fills the entire main area. The 64 bytes of the spare area are shown broken into five different fields on lines 236 through 246. This is merely an example; many different address maps could be used wherein the size, order and presence of fields may differ.

In table 220, column 222 shows the reference numbers (234 through 244) for each line in the table while columns 224, 226, and 228 show the first byte of the field's address within the page 108, the last byte, and the size of the field respectively. Column 230 indicates if the field is ECC protected or not. Column 232 indicates if the field is in the main or spare area, and column 234 describes the contents of each field.

The largest field is the user data on line 236 which in this example occupies the entire main area. The second largest field is on line 238 and comprises the 32 bytes assigned for ECC overhead bits. In the example from Mariano in FIG. 2A with 4-bit ECC correction, 28 bytes would be needed to store the BCH overhead bits for 2 KB of data. Since a portion of the spare area may also be ECC protected, an additional four bytes are allocated for those additional ECC overheads raising the total number of bytes to 32.

Metadata is data that describes something about other data. Thus a card catalogue (or an electronic equivalent) contains metadata about (the data in) the books in a library. The front matter in each book such as the copyright notice, publication history, table of contents, etc. (and arguably even its title, author's name, and cover art) are also metadata with respect to the book's contents.

In the context of non-volatile memories, metadata is typically information stored in the spare area that is relevant to the primary data stored in the main area, but may also be used for other things. For example, if the primary data is a continuous stream of measurements from a sensor, then associated metadata could contain such information as time stamps for the start of the measurements, the duration of the interval between measurements, information about how to read or interpret the data (i.e., the length of a data word, etc.), and such. This can be thought of as user metadata because it pertains to data stored by or for the user of the memory.

Another type of metadata is factory metadata. This is typically data in the spare area that relates to the function of the NVM itself rather than the specific data in the main area of the associated page or block. Examples of this type of data would be, for example "bad block data" (e.g., warning the user that the block or page has been physically damaged and is unreliable), wear data (e.g., recording the number of program/erase cycles a block (and by implication its pages) to allow wear leveling), etc.

Metadata can be protected by ECC or not as a matter of design choice. In the example illustrated in table 220, line 240 shows that 16 bytes are used for user metadata that is to be ECC protected and line 242 shows that eight bytes are used for non-ECC protected user metadata. The ECC overhead bits for the metadata 1 and metadata 2 areas will be included in the 32 bytes allotted for ECC overhead bits on line 238.

Lines 244 and 246 in the example in table 220 show four bytes each allocated for Factory Metadata and Reserved (e.g., unused or unallocated incase an additional field is needed at some time in the future). Reserved data is typically kept in the erased state which in flash technology is defined as each bit in each byte set to logic-1.

Preferred state encoding (PSE) is known in the art. The technique is used to encode data to statistically favor either logic-1 (typically the logic state with a higher voltage) or logic-0 (typically the logic state with a lower voltage) to achieve an advantage that is a function of the sensitivity of underlying hardware to the effects of the higher or lower voltages used to define the binary data. Typically the cost is the addition of an inversion bit per data word encoded to track whether the data in that particular word is inverted or not.

Referring to FIG. 3, table 300 illustrates an example of encoding a four-bit initial data word into a five-bit encoded data word favoring logic-0. The four columns 302 contain the 16 possible binary values for the four-bit initial data word. Column 304 shows the weight of the initial data word (i.e., the number of logic-1 bits present) which is obtained by adding the bits in the four columns 302 in each row. The average weight of all 16 four-bit data words is 2.00 as shown at the bottom of column 304.

The five columns 306 show the resulting five-bit encoded data word and column 308 shows the weights of the encoded data words with the average (1.56) shown at the bottom. Note that the values in columns E<3:0> are identical to columns D<3:0> when E<4>=logic-0 and are inverted when E<4>=logic-1. Thus bit E<4> is known as the inversion bit for the PSE encoded data E<4:0>. The ratio of the average weight of the encoded data words to the weight of the initial data words is shown at the bottom of column 310 to be 0.78 or 78%. Alternatively this can be thought of as a 22% statistical improvement in whatever condition motivates the preferred state encoding. Note that the average weight per word drops even though there are 25% more bits stored in each word relative to the initial data.

Referring to FIG. 4, table 400 shows the efficiency of preferred state encoding for initial data words of 4, 8, 16, 32, 64 and 128 bits. While a data word of arbitrary length could be encoded, the word lengths corresponding to even powers of two are typically of the most interest in the memory arts. Column 402 shows the number of initial bits per word, column 404 shows the improvement in the average weight of the preferred state encoded words, column 406 shows percentage improvement, and column 408 shows the percentage area cost of adding an additional bit. In general, the shorter the initial data word, the higher the percentage cost of the additional inversion bit and the more effective the PSE encoding.

In a well-known example from the DRAM art, the JEDEC standard for DDR4 SDRAM (JESD79-4, September 2012) allows the user the option of programming the meaning of the data mask bits to be the inverting bit of a preferred state encoding scheme favoring logic-1. DDR4 data bits are implemented in a pseudo-open drain fashion. Thus a data bit in the logic-1 state will draw no power after transitioning high, while a logic-0 state will still draw power after transitioning low. This allows the user to save power at the cost of losing the masking function.

In another DRAM example, U.S. Pat. No. 9,007,866 to Fisch et al, teaches using preferred state encoding favoring logic-0 inside a DRAM array to minimize array leakage current, reduce refresh frequency, and improve reliability since logic-1 bits (higher voltage) lose more charge to leakage than logic-0 bits (lower voltage). The cost is an extra data bit per encoded word in the memory array.

It will be appreciated by one skilled in the art that the preference for logic-1 or logic-0 depends on the underlying circuitry and that it may be advantageous to use different preferred state encoding in different parts of a system. It will also be appreciated that the advantages are statistical when amortized over the entirety of the data stored.

Preferred state encoding is also known in the non-volatile memory (NVM) art. In U.S. Pat. Nos. 7,525,864 and 7,990,796 to Brown, preferred state encoding is used to reduce the sense current required by preferentially storing data in the state requiring the least sense current during a read.

In U.S. Pat. No. 7,518,922 to Maejima et al, (henceforth Maejima) the preferred state technique is used to minimize the current necessary to charge the bit lines in various operations in a NAND flash part using both single level cells (SLC—one bit stored per cell) and multi-level cells (MLC—two bits stored per cell). Maejima further teaches that the encoding function can be performed in the NAND flash integrated circuit itself or in a memory controller.

U.S. Pat. No. 8,014,196 to Graef teaches that NVM devices employing MLCs can reduce the total programming energy by increasing the number bits needed to hold the data and only partially programming the MLCs.

In U.S. Pat. No. 8,756,464 to Kim et al, preferred state encoding is used for wear leveling the memory array by choosing the preferred logic state based on the stress to the memory cell during programming. This has the effect of extending the life of the memory by statistically increasing the number of program/erase cycles before the NVM wears out.

Unfortunately, each of these approaches only addresses a single issue and thus lacks flexibility. Further, they represent design choices for a particular use of preferred state encoding made by the NVM manufacturer based on assumptions of the best way for customers to use their NMV products. In practice this may or may not be optimal for any particular system designed by a user of the NVM integrated circuit or module.

DESCRIPTION OF THE DRAWINGS

FIG. 2A is a table illustrating the use of BCH codes in NAND flash memories.

FIG. 2B is a table of an address map illustrating an exemplary allocation map of the main and spare areas in an NVM page.

FIG. 3 is a table illustrating the preferred sate encoding of a four-bit initial data word to a five-bit encoded word favoring logic-0.

FIG. 4 is a table illustrating the trade-offs between data word length and overhead in preferred state encoding.

FIG. 6B is a table of an address map illustrating an exemplary allocation of the main and spare areas in an NVM page according to an embodiment of the present invention.

DETAILED DESCRIPTION OF THE INVENTION

Those of ordinary skill in the art will realize that the following figures and descriptions of exemplary embodiments and methods of the present invention are illustrative only and not in any way limiting. Other embodiments will readily suggest themselves to such skilled persons after reviewing this disclosure.

Figure 1A:
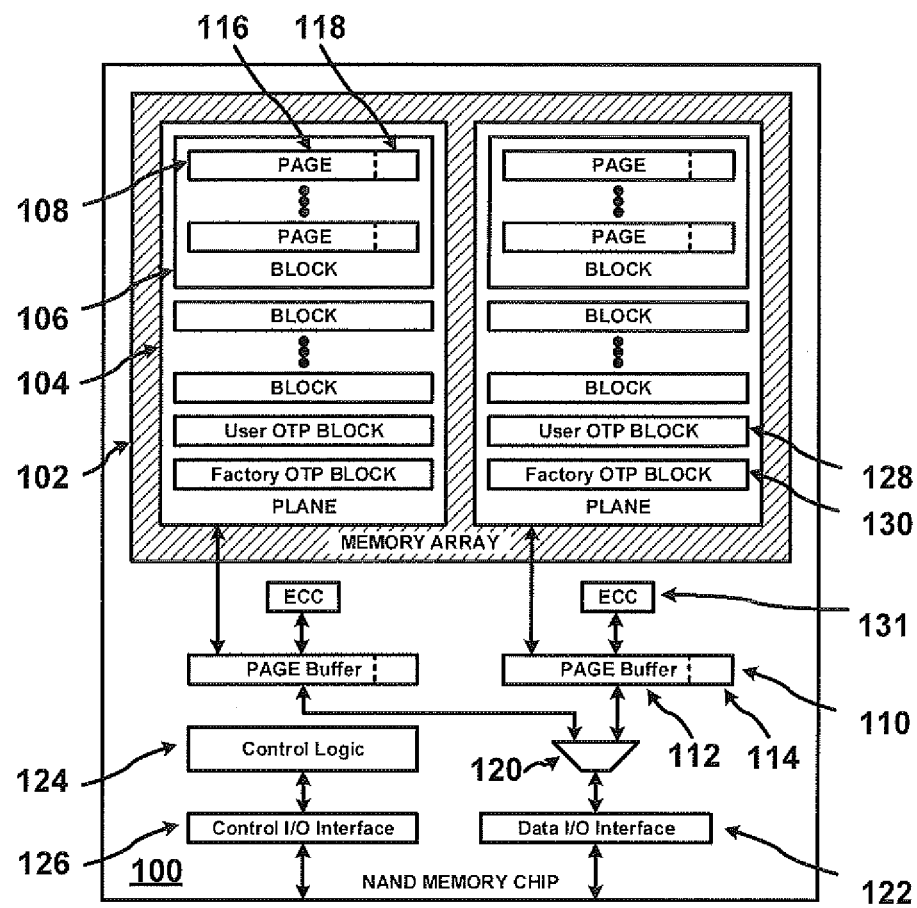
FIG. 1A is a block diagram of a conventional NAND flash memory integrated circuit.
Figure 1C:
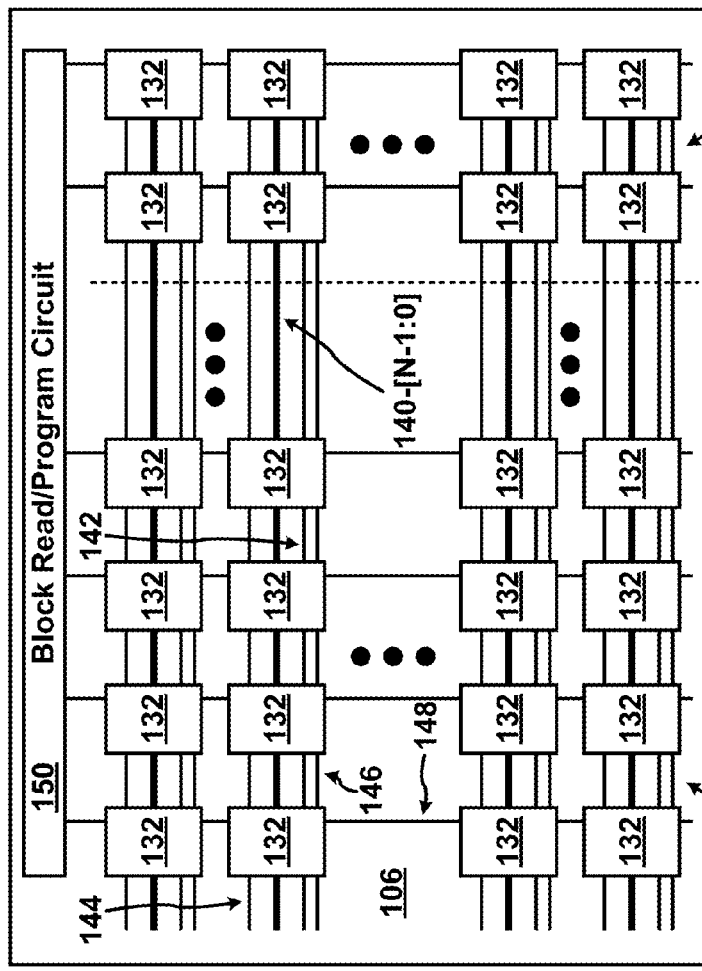
FIG. 1C is a block diagram showing more detail of a block used in the memory integrated circuit of FIG. 1A.
Figure 1B:
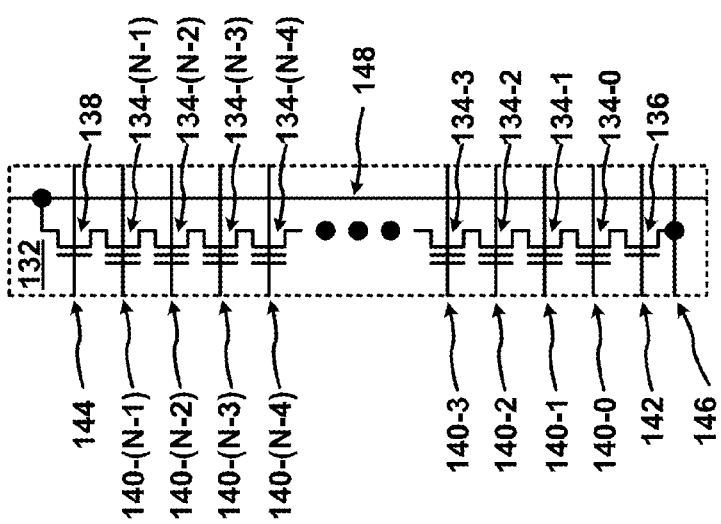
FIG. 1B is a circuit diagram of a NAND string used in the memory integrated circuit of FIG. 1A.
Figure 5:
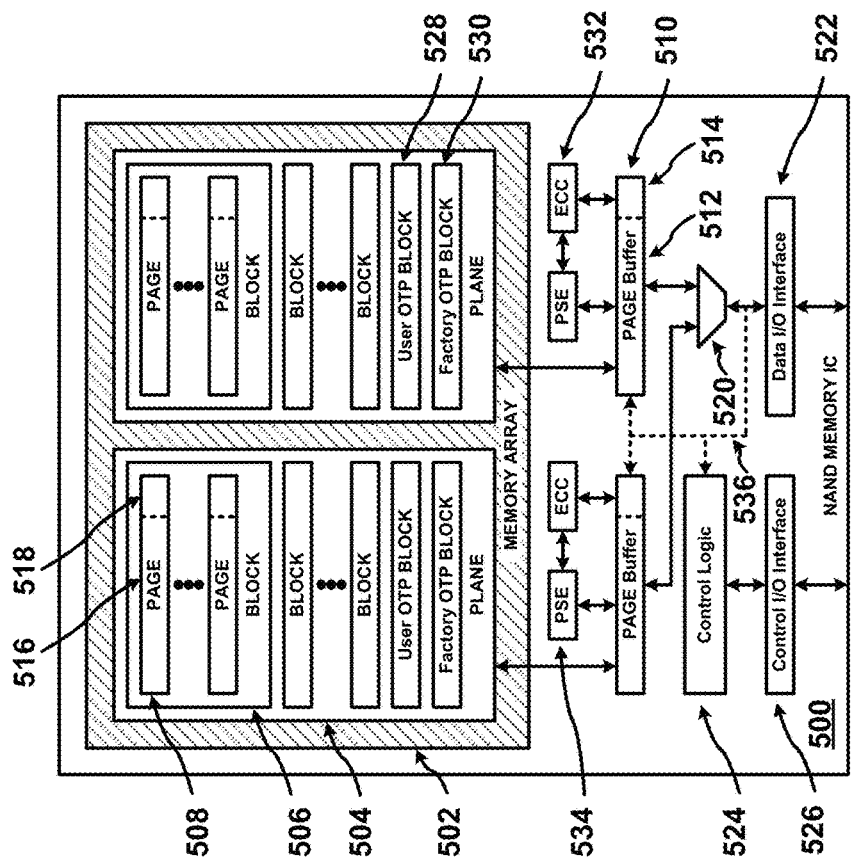
FIG. 5 is a block diagram of a NAND flash memory integrated circuit according to an embodiment of the present invention.

FIG. 5 illustrates a NAND flash memory integrated circuit 500 according to an embodiment of the present invention. While many of the features identified in FIG. 5 have many instances present, only one instance of each will be labeled to avoid overly complicating the figure and obscuring the inventive aspects therein.

NAND flash memory integrated circuit 500 comprises a memory array 502 comprising one or more planes 504, wherein each plane comprises a plurality of blocks 506 each further comprising a plurality of pages 508—a block 506 being the smallest erasable unit and a page 508 being the smallest programmable (writeable) unit of memory array 502.

Each plane 504 is coupled to at least one page buffer 510 associated with it. Each page buffer 510 comprises a main area 512 and a spare area 514 (illustrated as separated with a dashed line). Each page 508 comprises a main area 516 and a spare area 518 (also separated with a dashed line), wherein the storage capacities of main area 512 and main area 516 are substantially the same and the storage capacities of spare area 514 and spare area 518 are also substantially the same. This allows a page buffer 510 to be conveniently used as a staging area for read and write data for read and program operations respectively.

Each page buffer 510 is coupled to external circuitry through multiplexer 520 and data I/O interface 522 so that data can be written to or read from any page in the plane 504 associated with that particular page buffer 510. Persons skilled in the art will appreciate that if only a single plane 504 is present then multiplexer 520 is unnecessary and that other circuitry can be used either with or in place of multiplexer 520 as a matter of design choice.

NAND flash memory integrated circuit 500 further comprises control logic 524 and control I/O interface 526. Control logic 524 may comprise a large and complex state machine implemented in ASIC-type standard cells, but a microcontroller or microprocessor or other circuitry could also be used. Instructions to control logic 524 are input through input buffers in control I/O interface 526 and status information is output through one or more output buffers also contained in control I/O interface 526.

Special one-time programmable (OTP) blocks internal to memory array 502 may be present that can be used by either the manufacturer or the end user like, for example, user OTP block 528 and factory OTP block 530. These can be used for a variety of purposes including, for example, storing serial numbers, process and analog calibration measurements, design data and encryption keys. Once programmed these blocks can be locked to prevent tampering with the OTP data. The presence and capacity of these blocks will vary from embodiment to embodiment as a matter of design choice.

NAND memory integrated circuit 500 further comprises error correction code (ECC) circuit 532 coupled to page buffer 510 for encoding write data and decoding read data. NAND memory integrated circuit 100 comprised a conventional ECC circuit 132, but by itself it would not be adequate for use in the present invention. In particular, ECC circuit 532 is capable of generating a plurality of different error correction codes depending on the particular needs of a selected block 506 or page 508 in memory array 502. ECC circuit 532 preferably employs systematic error correction codes to minimize the impact of ECC on other forms of encoding such as preferred state encoding (PSE). Thus user write data will preferably be stored unaltered in the page buffer 510 main area 512 while the ECC and other overhead bits will be stored in the page buffer 510 spare area 514.

Many other circuits (and thousands of related signal lines) are present in integrated circuit 500, but are not shown in FIG. 5 to avoid overly complicating the diagram. In addition to the usual memory access circuits like row and column address decoders, sense amplifiers, and the like, there are typically many analog circuits such as band gap references, operational amplifiers, digital-to-analog and analog-to-digital converters, and charge pumps present that control logic 524 uses to provide the needed voltages to memory array 502 to allow read, program (write), and erase operations.

The various circuits 502 through 532 of NAND memory integrated circuit 500 may be analogous, similar or identical to the corresponding circuits 102 through 132 of conventional NAND memory integrated circuit 100. Persons skilled in the art will appreciate some degree of change to at least some of the conventional circuits will be required to implement the present invention. Such changes will be apparent to such skilled persons in light of this disclosure.

Also present in NAND memory integrated circuit 500 may be PSE circuit 534 coupled to page buffer 510 and ECC circuit 532. Preferred state encoding is used to store data in a manner that statistically favors either logic-1 or logic-0 in order to improve, for example, the performance, power, or reliability of the NVM memory cells in a particular block or page in memory array 502. Preferably, the PSE encoding will store the inverted or non-inverted data in the page buffer 510 main area 512 while the PSE overhead bits will be stored in the page buffer 510 spare area 514.

Persons skilled in the art will realize that both the ECC encoding and the PSE encoding overhead bits will both be competing for memory space in a finite sized spare area 514—along with other types of metadata. Thus in some embodiments of the present invention the strength of the ECC and the strength of the PSE may need to be traded off against one another, which requires an analysis of the relevant parameters to optimize and/or determine which ECC and PSE encoding schemes to use. Such skilled persons will further appreciate that because different blocks 506 and pages 508 may store different sorts of data and thus may have different needs, the optimization may be different for different blocks 506 and different pages 508.

Figure 6A:
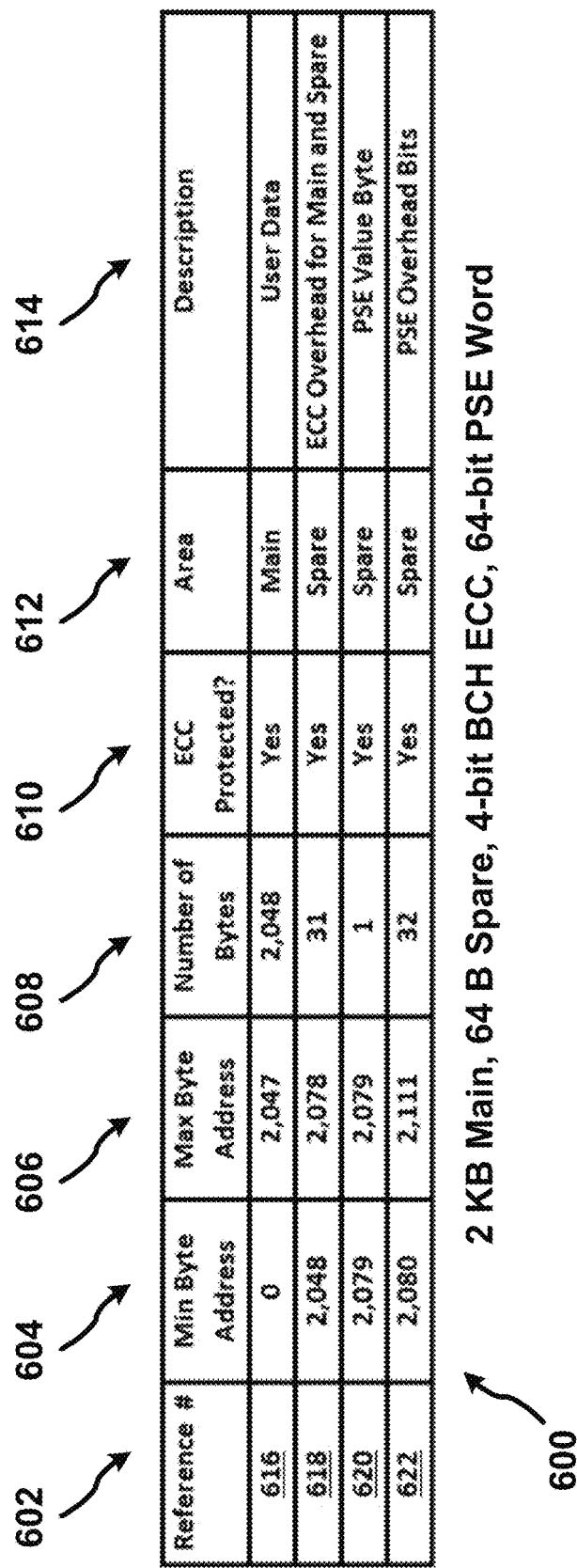
FIG. 6A is a table of an address map illustrating an exemplary allocation of the main and spare areas in an NVM page according to an embodiment of the present invention.

Table 600 in FIG. 6A is an address map illustrating an exemplary allocation of the main and spare areas in an NVM page according to an embodiment of the present invention. This allocation map assumes a 2,048 byte (2 KB) main area and a 64 byte (64 B) spare area with 4-bit BCH encoding and a 64-bit PSE word.

Each line in table 600 corresponds to a field in the allocation map. Column 602 shows the reference number for each field in the map, columns 604, 606 and 608 show the first byte address, the last byte address and the number of bytes in the field respectively. Columns 610, 612 and 614 show various characteristics of the field such as the ECC protection status, the portion of the page buffer 510 (or ultimately page 508) where the field resides, and a description of the contents, respectively. The user data field comprises 2,048 bytes and fills the entire main area 512 (and ultimately 516 after programming) as shown on line 616.

As in table 200 from FIG. 2A, the BCH encoding for the main area requires 28 B of storage in the 64 B spare area. FIG. 6A shows 31 bytes allocated to this function on line 618 to allow extra bits for the ECC overhead of the PSE overhead data in the fields on lines 620 and 622.

Line 620 indicates a one byte field which holds the PSE Value—the information indicating whether the PSE favors logic-0 or logic-1. In some embodiments a single bit would be sufficient, but encoding an entire byte with all logic-0s or all logic-1s is preferable since it is more resistant to a single bit failure. In some embodiments several preferred state values could be used in the same page—up to eight in this example.

Line 622 indicates the 64-bit PSE encoding overhead amounts to 32 bytes. While this level of ECC encoding and PSE encoding can be implemented in this hardware arrangement, there are no full bytes available for any user or factory metadata (though it is possible a few bits might be left over in the ECC overhead area in some embodiments).

Persons skilled in the art will realize that tradeoffs can be made to ease the fully packed allocation map of FIG. 6A. For example, the ECC protection could be reduced to 3-bits of ECC which would free up eight bytes which could be used for another field, like for example, user metadata or factory metadata. Alternatively, the PSE word length could be increased to 128-bits which would free up 16 bytes for other uses.

The relative importance of a variety of factors can play into this sort of tradeoff. For example, if the data to be stored is a picture, then it may be desirable to lower the level of ECC encoding since a small number of bad pixels may not be noticed when a picture is viewed, while if the data to be stored is executable code (e.g., software) then it might be desirable to increase the level of ECC since a single bad bit can completely destroy the functionality of the code and might even crash the entire system.

If data is to be written once and read many times, then it may be desirable to increase the granularity (e.g., shorten the PSE word) of the PSE encoding to minimize the read current to save power, while if the block 506 or page 508 is used for a function that will require a significant number of program and erase cycles, then it may be desirable to use PSE encoding to minimize program and erases stresses to increase long term reliability of the block. Persons skilled in the art will realize there are many ways that tradeoffs could be made between the various fields in an allocation map.

Figure 6C:
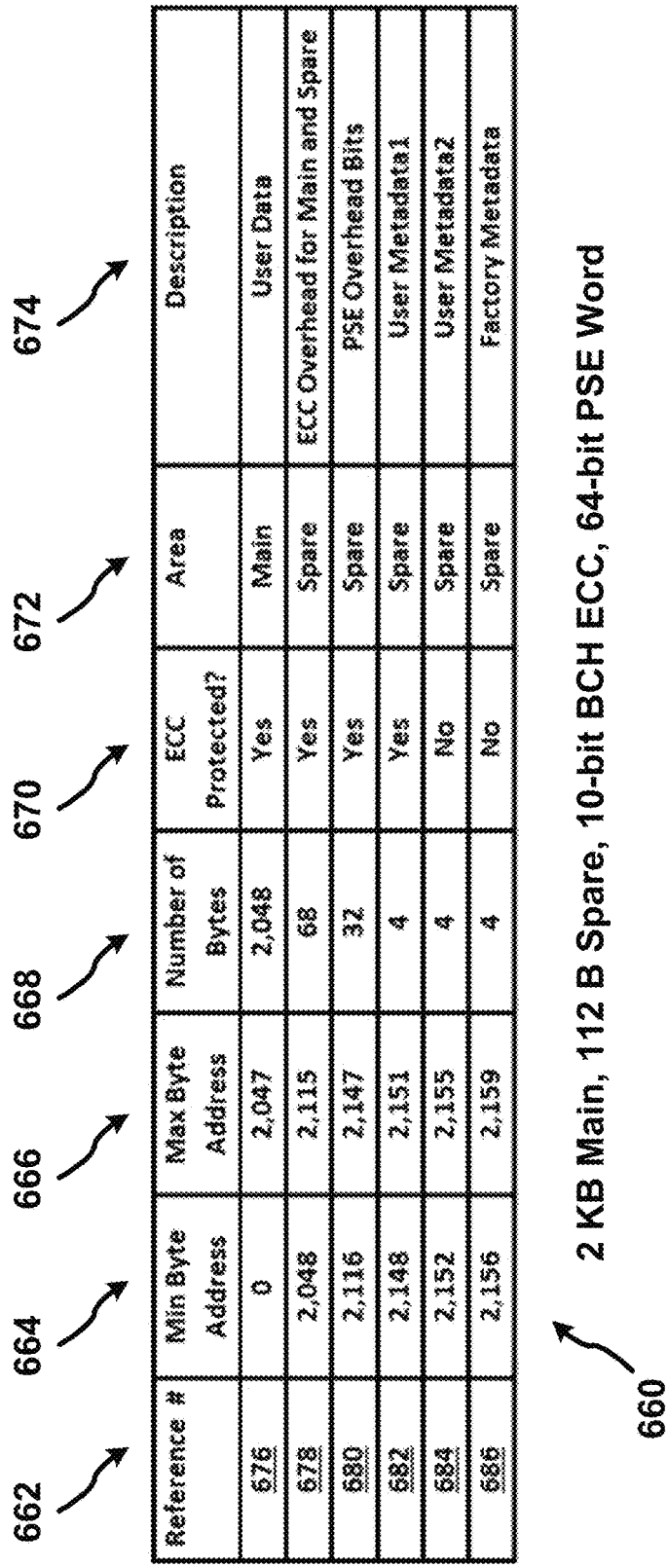
FIG. 6C is a table of an address map illustrating an exemplary allocation of the main and spare areas in an NVM page according to an embodiment of the present invention.

FIGS. 6B and 6C comprise tables 630 and 660, respectively, each representing two different address maps each illustrating another exemplary allocation of the main and spare areas in an NVM page according an embodiment of the present invention. Both cases assume a 2 KB main area, a 112 B spare area, and the requirement of a four byte factory metadata field.

In Table 630 of FIG. 6B column 632 comprises the reference numbers for each field, columns 634, 636 and 638 the show the first byte address, the last byte address and the number of bytes in the field respectively. Columns 640, 642 and 644 show various characteristics of the field such as the ECC protection status, the portion of the page buffer 510 (and ultimately in page 508 after programming) where the field resides, and a description of the contents, respectively. The user data field comprises 2,048 bytes and fills the entire main area 512 (and ultimately 516) as shown on line 646.

Since this exemplary address map uses 4-bit BCH encoding, 32 bytes are allotted in the spare area for the ECC overhead bits as shown on line 648. Since a 112 B spare area is assumed, the granularity of the PSE encoding can be increased (e.g., the PSE word can be shortened). With a 2 KB main area and a 32-bit PSE word, 64 bytes can be allotted for this purpose (see line 650) with 16 bytes remaining which are allocated to three different fields on lines 652, 654 and 656.

In Table 660 of FIG. 6C column 662 comprises the reference numbers for each field, columns 664, 666 and 668 the show the first byte address, the last byte address and the number of bytes in the field respectively. Columns 670, 672 and 674 show various characteristics of the field such as the ECC protection status, the portion of the page buffer 510 (and ultimately page 508) where the field resides, and a description of the contents, respectively. The user data field comprises 2,048 bytes and fills the entire main area 512 (and ultimately 516) as shown on line 676.

Since this exemplary address map uses 10-bit BCH encoding, 68 bytes are allotted in the spare area for the ECC overhead bits as shown on line 678. With a 2 KB main area and a 64-bit PSE word, 32 bytes can be allotted for this purpose (see line 680) with 12 bytes remaining which are allocated to three different fields on lines 682, 684 and 686.

The exemplary allocation maps in FIGS. 6B and 6C show the sort of tradeoffs that can be made in one embodiment of the invention. The map in FIG. 6B uses a moderate amount of ECC strength and more space was devoted to using PSE for some purpose such as, for example, increasing reliability (e.g., reducing stress during reading or programming) or lowering the average sense current when reading the data back from page 508. The map in FIG. 6C uses a very strong ECC with less space devoted to using PSE. Both allocation maps could be used in the same embodiment depending on the needs of a particular page 508 or block 506. Further, if there are three or more types of data to be stored in integrated circuit 500, one or more additional allocation maps may be used for each type.

As will be appreciated by persons skilled in the art, many possible trade-offs with regards to main area size, spare area size, ECC level, PSE word length and value(s), and other types of metadata are possible for both the NVM hardware manufacturers and the NVM end users. Such skilled persons will realize that many different sized pages 508 could be used, for example, having different sized main areas 512 and spare areas 514.

Figure 7A:
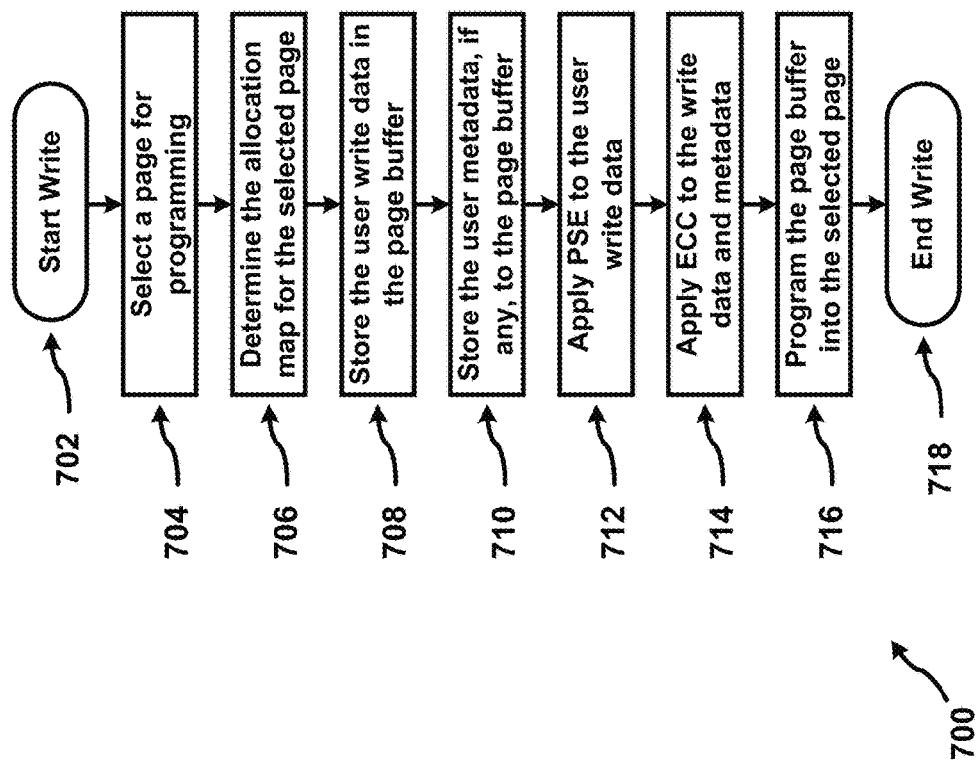
FIG. 7A is a flow chart illustrating a programming operation of an embodiment according the present invention.

Flow chart 700 in FIG. 7A illustrates a method for programming data into NAND flash memory integrated circuit 500 according to the present invention. At step 702 a write (program) operation may be initiated by an external memory controller (not shown in FIG. 7A) sending a program command to control logic 524 through control I/O interface 526. Persons skilled in the art will appreciate that in other embodiments the memory controller need not be external to NAND flash memory integrated circuit 500, and could instead be, for example, located in the NAND flash memory circuit 500 and that such alternate embodiments are within the scope of the invention.

The program command will typically include an address which at step 704 selects the specific page 508 in array 502 to be programmed.

At step 706, an allocation map may be selected for the type of data to be written into page 508. The allocation map can be sent from the memory controller, read from a location in array 502, or calculated on the fly (either internal or external to flash memory circuit 500) based on one or more parameters. The allocation map or a pointer to where the allocation map is stored is an example of metadata that might be stored in page buffer 510 before programming.

The program command is typically accompanied by the external data to be written into the selected page 508. At step 708 this user write data may be input through data I/O interface 522 and multiplexer 520 and preferably stored in the main area 512 of page buffer 510. Persons skilled in the art will appreciate that the write data need not be sourced externally to NAND flash memory integrated circuit 500 and could instead be sourced internally from another page 508 in the NAND flash memory circuit 500 and that such alternate embodiments are within the scope of the invention.

The user write data in step 708 may have associated with it user metadata to be written into the selected page 508. At step 710 this user metadata is typically input through data I/O interface 522 and multiplexer 520 and preferably stored in the spare area 514 of page buffer 510. Persons skilled in the art will appreciate that the metadata need not be sourced externally to NAND flash memory integrated circuit 500 and could instead be sourced internally to the NAND flash memory circuit 500 and that such alternate embodiments are within the scope of the invention. Such skilled persons will also appreciate that if there is any factory metadata to be written to page 508 that it may be stored in the spare area 514 at this time.

With all of the user write data and metadata, if any, stored in page buffer 510, the data can now be processed with both PSE encoding and ECC encoding to optimize it for programming and later reading.

At step 712, the PSE encoding may be applied to the data in the main area 512. Further details will be discussed below in conjunction with FIG. 7B.

At step 714, the ECC encoding may be applied to fields in both main area 512 and spare area 514. Further details will be discussed below in conjunction with FIG. 7C.

At step 716, when all of the data manipulations and encodings are complete, page buffer 510 contains the data that will physically be stored in page 508. At this time, the contents of page buffer 510 may be written to the selected page 508 in a conventional manner understood by those skilled in the art.

At step 718, control logic 524 may signal the memory controller that the write (programming) operation is complete and that another operation may be initiated.

Figure 7B:
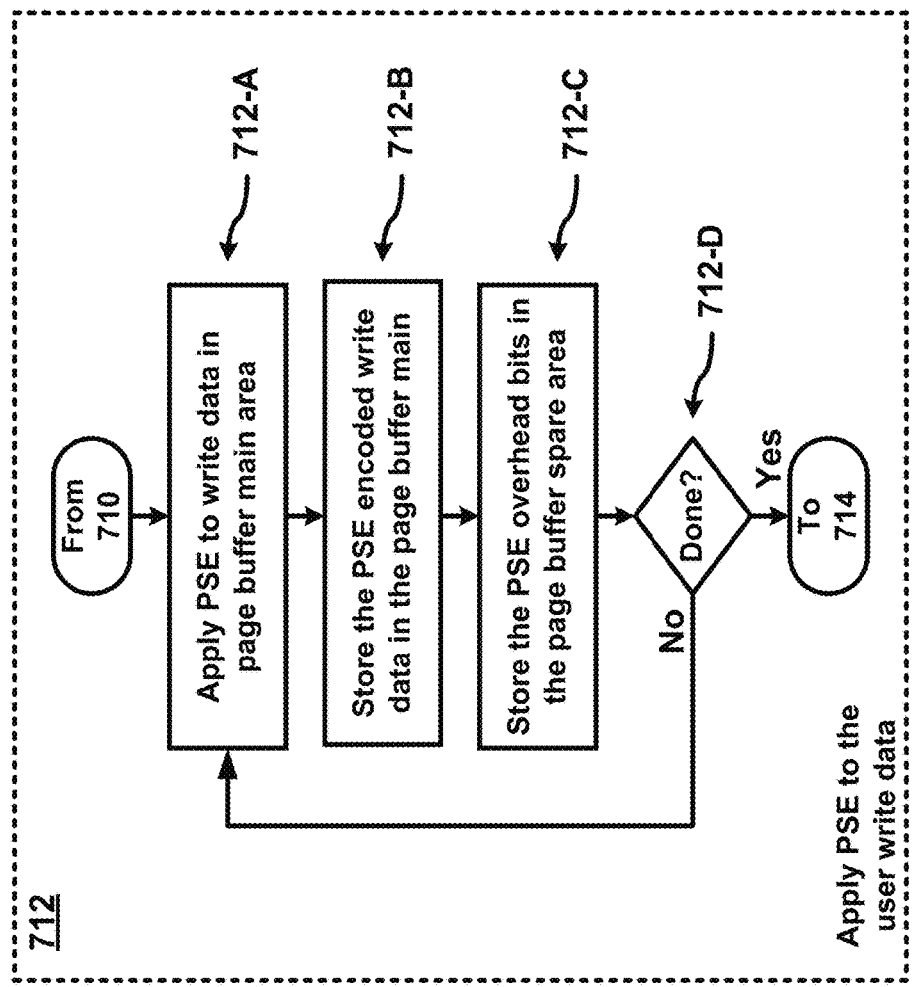
FIG. 7B is a flow chart illustrating more details of the operation of the embodiment of FIG. 7A.

FIG. 7B shows more detail with respect to step 712. At step 712-A, the preferred state encoding (PSE) may be applied to the user data in the main area 512. PSE may also be applied to any metadata in the spare area 514 as a matter of design choice. Since spare area 514 is typically about 3% the size of main area 512 there may be a tradeoff between the benefit of applying PSE there versus the complexities and the processing time.

When the PSE encoding is done, there will be a number of encoded bits equal to the number of bits in the original PSE word length plus an additional overhead bit for that word to be stored as metadata. At step 712-B the PSE encoded data is written back into main area 512 in the same location as the original user data, and at step 712-C the overhead bit is stored in spare area 514 at the bit location for that PSE word.

Persons skilled in the art will realize that applying steps 712-A, 712-B and 712-C is a cyclical process and that the steps may not all be executed in order or the same number of times. For example, in one embodiment the data is read from main area 512 one PSE word at a time (step 712-A), the encoded data is written to the main area (step 712-B), and then the overhead bit is held in a register, for example, until a full byte (or even the full PSE overhead area) is complete, and only then written to spare area 514 (step 712-C). Whatever the exact order or number of steps, each cycle a check will be performed at step 712-D to determine if the last PSE word is encoded. If not, the cycle is repeated until the PSE encoding for the main area is complete before proceeding on to step 714.

Figure 7C:
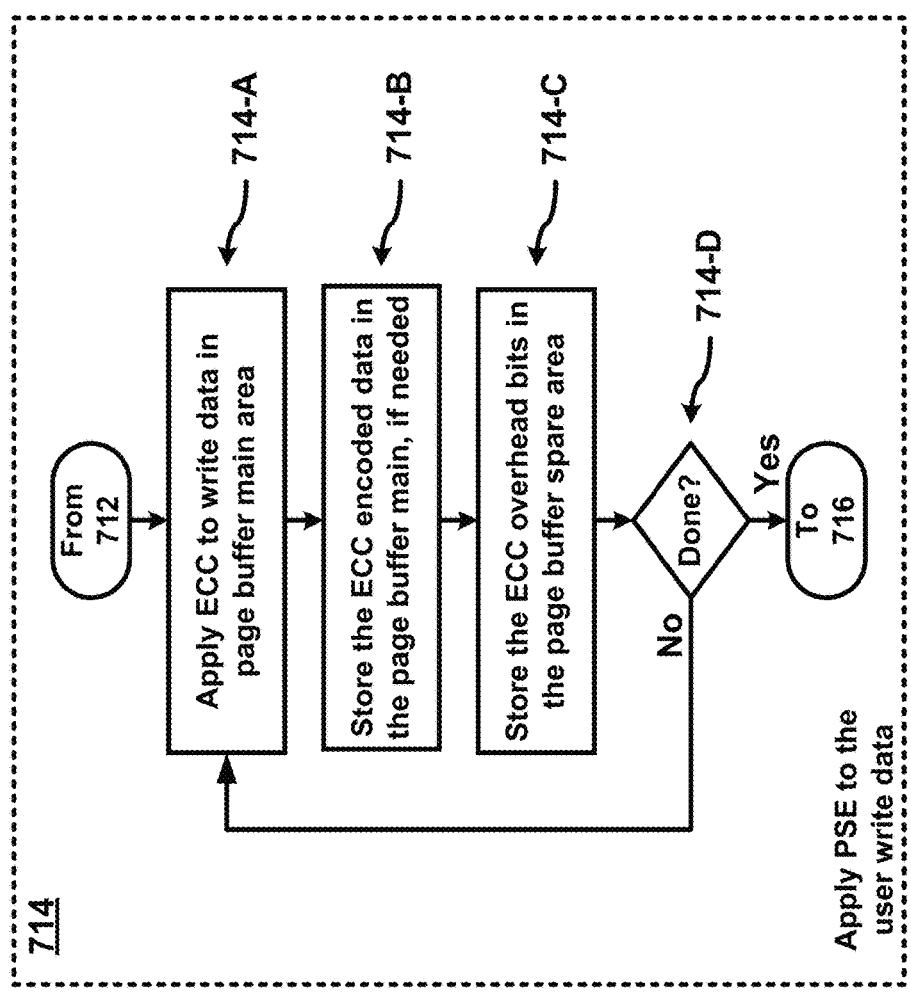
FIG. 7C is a flow chart illustrating more details of the operation of the embodiment of FIG. 7A.

FIG. 7C shows more detail with respect to step 714. At step 714-A, the error correction code (ECC) encoding may be applied to the user data in the main area 512. Applying ECC encoding to all the metadata in the spare area 514 is highly desirable though it is not always feasible depending on the nature of the metadata. All, some or none may be encoded as a matter of design choice.

The ECC encoding is preferably done using a block code so there will be a number of encoded bits equal to the number of bits in the original ECC word length plus additional overhead bits for that word to be stored as metadata. At step 714-B the ECC encoded data is written back into main area 512 in the same location as the original user data, and at step 714-C the overhead bits is stored in spare area 514 at the bit locations for that ECC word.

Persons skilled in the art will realize that applying steps 714-A, 714-B and 714-C is a cyclical process and that the steps may not all be executed in order or the same number of times. For example, in one embodiment the data is read from main area 512 one ECC word at a time (step 714-A), the encoded data is written to the main area if the code is not systematic (step 714-B), and then the overhead bits are held in a register, for example, until a full byte (or ECC word or even the full ECC overhead area) is complete, and only then written to spare area 514 (step 714-C). Whatever the exact order or number of steps, each cycle a check will be performed at step 714-D to determine if the last ECC word is encoded. If not, the cycle is repeated until the ECC encoding for the main area is complete before proceeding to step 716.

In a preferred embodiment of the invention, the ECC encoding is the last change made to the data in page buffer 510 before programming page 508. This ensures that any errors due to programming, noise, reading the data back out, etc., will be best protected with the maximum ECC coverage.

Figure 8:
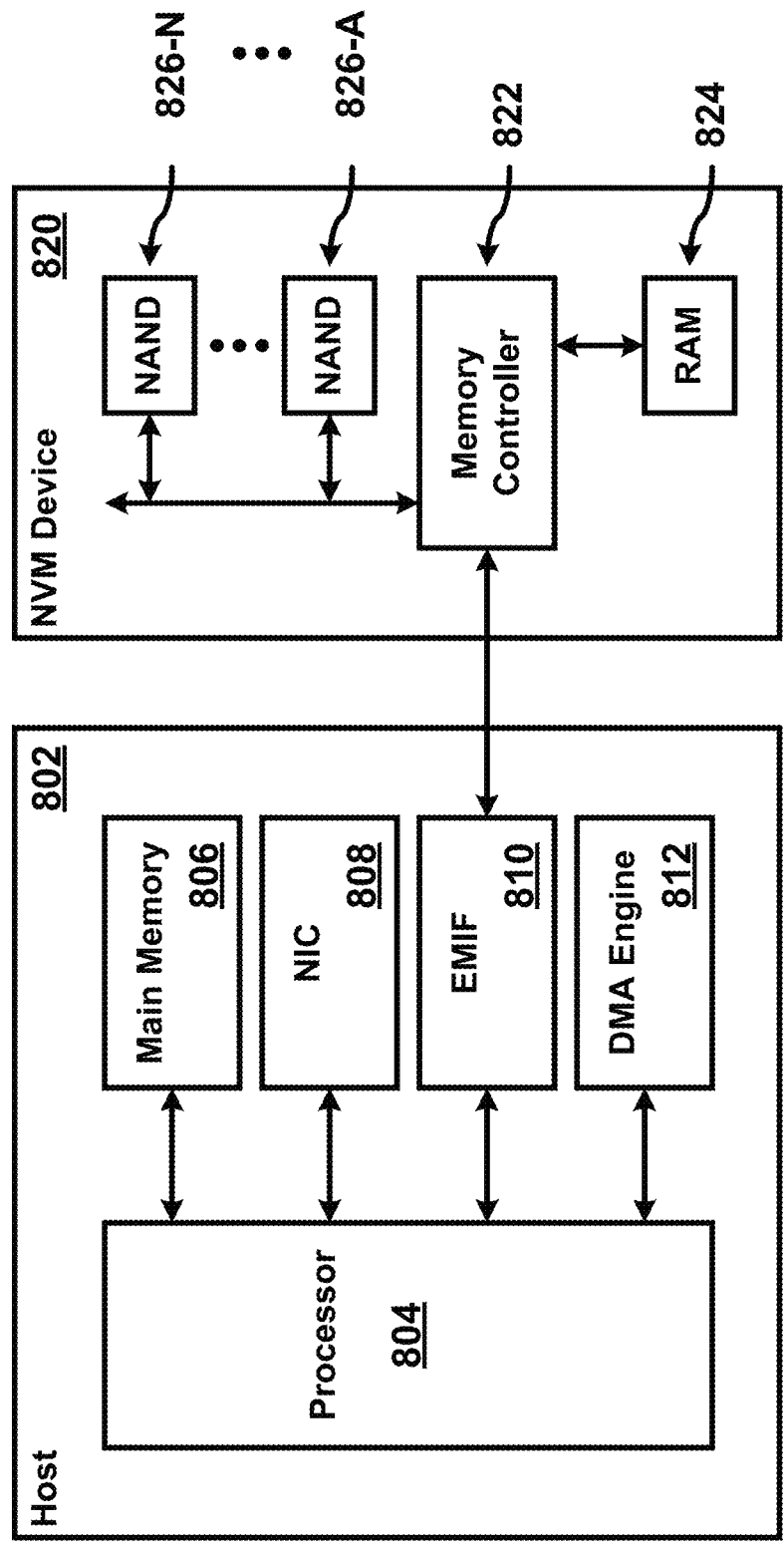
FIG. 8 is a block diagram of a system according to the present invention.

Referring to FIG. 8, a system 800 according to the present invention is shown. System 800 comprises a host 802 coupled to a NVM device 820. Host 802 comprises a processor 804 coupled to main memory 806, network interface card (NIC) 808, external memory interface (EMIF) 810, and DMA controller 812. Host 802 as illustrated is very generic and may be any data processing system requiring non-volatile memory like, for example, an embedded microcontroller system, a household appliance, a remote sensor, a camera, a cell phone, a tablet, a laptop or desktop computer, a server blade, or a controller in a disk array. Persons skilled in the art will realize that other components may be present (and some shown may be absent or organized differently) in host 802 depending on its intended use and that such embodiments are design choices within the scope of the invention.

Processor 804 may be one of a variety of different types like, for example, a central processing unit (CPU), a microprocessor unit (MPU), a microcontroller (uC), or one or more cores in a multi-core processor. Processors typically have a main memory 806 used to store executable code, data, and the results of calculations. In many systems this is implemented with synchronous dynamic random access memory (SDRAM) though other types of memory may be used.

NIC 808 may be a discrete network interface card like, for example, of the sort found mounted in a socket on a motherboard in a system such as a server or desktop computer. It may also take the form of, for example, a wireless networking chip mounted on a printed circuit board (PCB) to implement a wireless standard like, say, Bluetooth or Wi-Fi. NIC 808 is typically used as a source of data and storage for host 802, though other devices not shown in FIG. 8 like, for example, a hard disk drive may be present and used similarly.

EMIF 810 may be a circuit designed to communicate with memory controller 822 in NVM device 820 by means of a standard protocol like, for example, eMMC, ONFI, or USB. EMIF may be a separate circuit as shown in FIG. 8, but other implementations are possible. In some embodiments EMIF 810 may, for example, be a circuit embedded internal to processor 804.

Typically NVM device 820 will be used to store and retrieve large quantities of data. DMA engine 812 may be used to control the movement of data quickly between main memory 806, NIC 808 and EMIF 810 using connections not shown in FIG. 8 to avoid overly complicating the disclosure.

NVM device 820 typically comprises memory controller 822 coupled to random access memory (RAM) 824 and one or more NAND flash devices 826-A through 826-N. NVM device 820 as illustrated is very generic and may be, for example, single integrated circuit, a USB (or thumb) drive, a solid state drive (SSD), a memory card for use in handheld devices like, for example, cell phones and cameras (e.g., SD, microSD, MMC, eMMC, xD, etc.), a package on processor (POP) memory, or a multi-chip package (MCP) memory mounted on a printed circuit board (PCB). Persons skilled in the art will realize that other components may be present (and some shown may be absent or organized differently) in NVM device 820 depending on its intended use and that such embodiments are within the scope of the invention.

In one embodiment of the present invention, NVM device is a single integrated circuit comprising memory controller 822, RAM 824, and one or more NAND blocks on a single silicon chip. In such an embodiment memory controller 822 might be a state machine or a simple microcontroller. RAM 824 may be small, not even be present, or not implemented using typical RAM technology. NAND devices 826 may be different arrays or planes in the integrated circuit or merely a single array as in NAND flash integrated circuit 500.

In another embodiment, memory controller 822 may be a discrete NAND flash controller chip and NAND devices 826 may be, for example, one or more integrated circuits or multi-chip packages containing multiple integrated circuits. RAM 824 may not be present or may be either external to or embedded inside memory controller 822. Memory controller 822 may be a specialized microcontroller or other circuit adapted to interface with NAND devices 826.

In yet another embodiment, EMIF 810 may be coupled directly to one or more NAND devices and the functions performed by memory controller 822 and RAM 824 may instead be performed internally by processor 804. Alternatively, processor 804 may perform those functions in software replacing memory controller 822 and 824 entirely.

Memory controller 822 may perform a number of functions like, for example, interfacing with EMIF 808 and with NAND flash devices 826-A through 826-N, translating commands from the host 802 into the format the NAND flash devices 826 require, and sending data to and from NAND flash devices 826 and EMIF 810. Memory controller 822 also may perform various NAND maintenance functions like wear leveling, bad block mapping, block picking, garbage collection, and mapping logical addresses (from the host) to the physical addresses internal to the NAND flash devices 826.

NAND flash devices 826 are used by NVM device 820 for data storage. They may be devices like NAND flash memory integrated circuit 500 or others according to the present invention. In the present disclosure, the exemplary embodiments have been NAND flash devices since that is the currently dominant NVM technology. Persons skilled in the art will realize that any non-volatile memory technology like, for example, NOR flash, ferroelectric RAM (FRAM or FeRAM), magneto-resistive RAM (MRAM), resistive RAM (RRAM or ReRAM), phase-change memory (PCM or PRAM), and others, may benefit from the encoding methods described herein applied uniquely to the needs of each technology. Such persons will recognize that such use in alternate memory technologies is within the scope of the invention.

Referring now to FIG. 7A along with FIG. 8, the start write request at step 702 will typically come from the operating system or an application executing on processor 804 in host 802. Alternatively, the request might originate from a remote system, be received in NIC 808, and forwarded to NVM device 820 through EMIF 810, or the request could also originate from Memory Controller 822 in certain cases like, for example, some NAND maintenance tasks.

The page to be programmed at step 704 may come with an address designating the block and page along with the write request, though other cases are possible. For example, the write command may be to copy the contents of an entire block to a different block, and the first write command may supply the source and destination block addresses. In such a case either the memory controller 822 or a circuit like, say, a counter on the NAND device 826 would calculate the current address for the selected page for each page one write at a time throughout the entire block-to-block read and copy.

At step 706, the desired allocation map for the page selected to be programmed may come from different sources depending on the location. In one embodiment it may, for example, be stored in main memory 806 and sent to memory controller 822 before or after the write command from processor 804, while in a different embodiment it might be calculated on the fly in software running on processor 804. In another embodiment the allocation map may be stored internal to NVM device 820 in, for example, RAM 824 or one of the NAND devices 826 and the write command may indicate which allocation map to use. Thus allocation maps may be defined and permanently stored as part of the system 800 or NVM device 820 architecture, or may be calculated from one or more parameters as a matter of design choice.

At step 708, in one embodiment the user write data may come from, for example, main memory 806 via EMIF 810, an external computer via DMA 812 and EMIF 810, the same NAND device 826 comprising the selected page, or from a different NAN D device 826 in NVM device 820. The user write data may also come from different places at different times in the same embodiment.

At step 710, in one embodiment the user metadata may come from, for example, main memory 806 via EMIF 810, an external computer via NIC 808 and EMIF 810, the same NAND device 826 comprising the selected page, or from a different NAN D device 826 in NVM device 820. The user metadata may also come from different places at different times in the same embodiment.

At step 712, in one embodiment the PSE data may encoded by control circuitry internal to the NAND device 826 comprising the selected page, and in another embodiment it may be controlled by control circuitry elsewhere internal to system 800. It may be encoded by parsing the original data for the PSE word and deciding to encode for logic-0 or logic-1 on the fly based on the write data contents. Alternatively, the encoding for logic-0 or logic-1 may be preselected as part of the allocation map definition. In another embodiment the memory controller 822 may monitor the user write data, choose the PSE encoding state or states (for different PSE words), and forward the encoding choice as metadata. In another embodiment, memory controller 822 may perform the encoding task and forward both the encoded data and the overhead bits to NAND device 826 to be directly stored in the page buffer. In yet another embodiment, the PSE encoding could be performed entirely in software in processor 804 or elsewhere.

At step 714, in one embodiment, the ECC encoding may be preferably performed on the user data and metadata by control circuitry internal to NAND device 826, because ECC encoding is computationally involved and dedicated hardware on NAND device 826 is typically more efficient than other methods. In other embodiments, the ECC encoding may be performed in control circuitry like, for example, memory controller 822, processor 804, or EMIF 810.

At step 716 the contents of the page buffer are programmed into the selected page, and at step 718 on the completion of the write operation NAND device 826 signals memory controller 822 that the device is ready to perform another operation.

Persons skilled in the art will appreciate that the order and number of times each step in FIG. 7A is executed may vary from embodiment to embodiment. For example, in one embodiment the steps 708 and 710 storing the data and metadata into the page buffer could be performed before the selection of the allocation map in step 706. In another embodiment where the PSE encoding of step 712 and/or the ECC encoding of step 714 is performed, for example, in memory controller 822 or processor 804, steps 712 and 714 might be performed before the write command is issued in step 702. Many such possibilities will be apparent to those skilled in the art.

Figure 9:
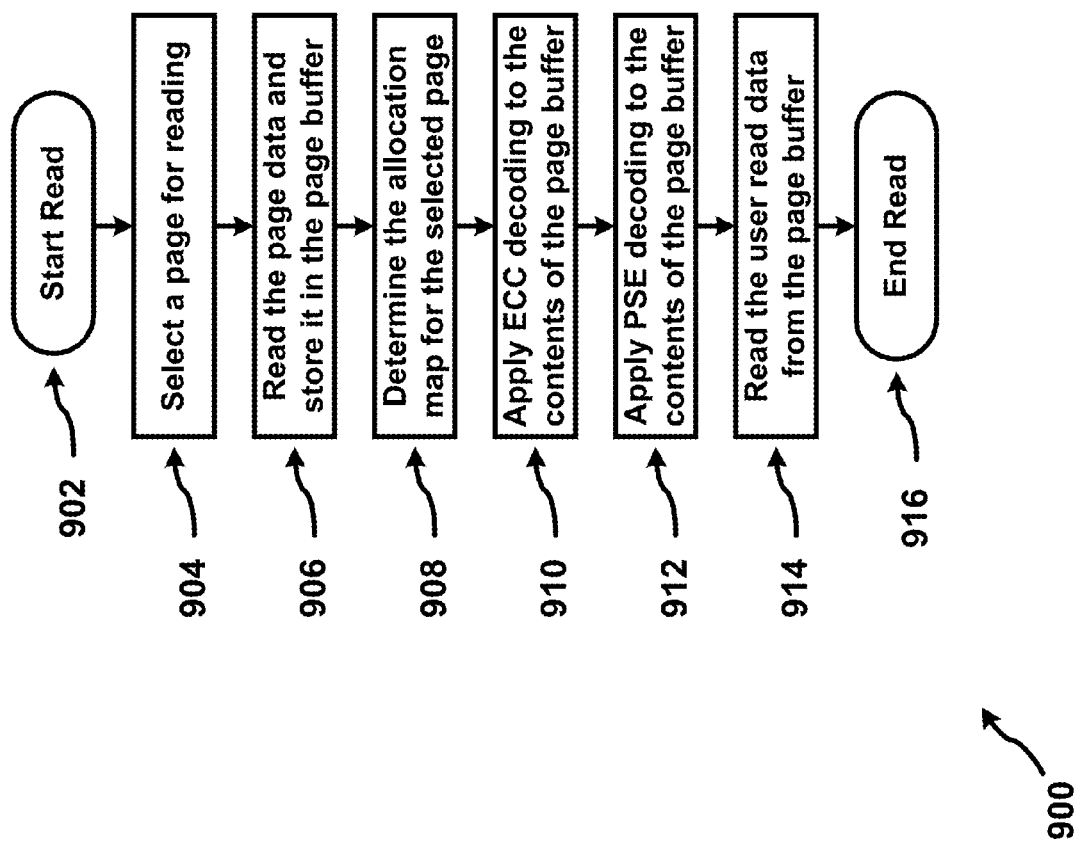
FIG. 9 is a flow chart illustrating a reading operation of an embodiment according the present invention.

Flow chart 900 in FIG. 9 illustrates a method for reading data from NAND flash memory integrated circuit 500 according to the present invention. This involves reversing the encodings and other transformations applied in FIGS. 7A, 7B and 7C to reproduce the original user write data as user read data to be sent where requested.

At step 902, the read command may be sent to NAND flash memory integrated circuit 500. The read command may typically be accompanied by a page address. In some cases like, for example, a block move comprising a series of page read and then writes, the page address may come from another source like, for example, control logic 524, EMIF 810 or processor 804 as described in conjunction with FIGS. 5 and 8.

At step 904, the page address may be used to select the desired page for reading.

At step 906 the data may be read from the selected page and may be written into page buffer 510.

At step 908, the allocation map for the page buffer 510 contents may be determined. In some embodiments this may be preferably stored in the selected page as metadata, while in others it may be stored elsewhere (e.g., in another page in NVM device 500, a different NVM device 826, or main memory 806) as described in conjunction with FIGS. 5 and 8.

At step 910, ECC decoding may be applied to the contents of page buffer 510. If successful, any bit errors with in the page that have occurred since the original ECC encoding described at step 714 in FIG. 7A may be corrected. If unsuccessful (e.g., due to more errors than the ECC method used can correct) a procedure beyond the scope of this disclosure will be implemented by NVM device 500.

At step 912, PSE decoding may be applied to the contents of page buffer 510 restoring the original user write data as user read data.

At step 914, the user read data may be read from page buffer 510 to the desired destination like, for example, another block 508 internal to NVM device 500, another NVM device 826, memory controller 822, RAM 824, EMIF 810 or main memory 806 as described in conjunction with FIGS. 5 and 8.

At step 916 the current read operation may be complete, though commands involving multiple read operations may loop back to step 902 to begin the next operation (not shown in FIG. 9) in response to, for example control logic 524, memory controller 822 or EMIF 810 as described in conjunction with FIGS. 5 and 8

Persons skilled in the art will appreciate that the order and number of times each step in FIG. 9 is executed may vary from embodiment to embodiment. For example, determining the allocation map determined at step 906 may come with the read command and occur before step 902. In another case where, for example, the contents of the page buffer are to be programmed into another page 508 internal to NVM device 500 steps 912 and 914 may not be needed. Since step 910 restores the contents of page buffer 510 to the state right after step 714 in FIG. 7A, it is ready to write to another page 508 and steps 702 through 712 may not be needed. Many such possibilities will be apparent to those skilled in the art.

Many embodiments and methods allowing both manufacturers and end users to use different variations of PSE encodings and ECC encodings to optimize the storage of data in NVM devices have been described. Those of ordinary skill in the art will realize that the above figures and descriptions are exemplary only. Many other embodiments will readily suggest themselves to such skilled persons after reviewing this disclosure. Thus the invention is not to be limited in any way except by the issued claims.

What is claimed is:

1. A method for encoding data in a non-volatile memory (NVM) device, wherein the NVM device comprises a memory array having a plurality of pages, a page buffer coupled to the memory array, and a data input/output interface coupled to the page buffer, the method comprising the steps of:
   (A) selecting a first page in the memory array for programming;
   (B) storing first user write data from the data input/output interface into the page buffer;
   (C) applying preferred state encoding (PSE) to the first user write data to create first PSE encoded write data and storing the first PSE encoded write data in the page buffer according to a first allocation map;
   (D) applying error correction encoding to the first PSE encoded write data to create first error correction code (ECC) encoded write data and storing the first ECC encoded write data in the page buffer according to the first allocation map; and
   (E) programming the first contents of the page buffer into the selected first page in the memory array.

2. The method of claim 1, wherein the NVM device is a NAND flash memory integrated circuit.

3. The method of claim 1, comprising the further steps of:
   (F) storing user metadata into the page buffer; and
   (G) applying error correction encoding to at least a portion of the metadata to create ECC encoded metadata and storing the ECC encoded metadata in the page buffer.

4. The method of claim 3,
   wherein each page in the memory array, including the selected first page, comprises a main area and a spare area;
   wherein the page buffer comprises a main area corresponding to the selected page main area and a spare area corresponding to the selected page spare area;
   wherein the first PSE encoded write data created in step (C) comprises a portion corresponding to the first user write data and a portion of generated first PSE overhead bits;
   wherein the first ECC encoded write data created in step (D) comprises a portion corresponding to the first user write data, a portion corresponding to the first PSE overhead bits, and a portion of generated first ECC overhead bits;
   wherein the portion of the first ECC encoded write data corresponding to the first user write data is stored in the page buffer main area;
   wherein the portion of the ECC encoded write data corresponding to the first PSE overhead bits is stored in the page buffer spare area;
   wherein the portion of the first ECC encoded write data corresponding to the first ECC overhead bits is stored in the page buffer spare area; and wherein during step (E), data in the page buffer main area is programmed into the first selected page main area, and data in the page buffer spare area is programmed into the first selected page spare area.

5. The method of claim 4, the method comprising the steps of:
   (A') selecting a second page in the memory array for programming;
   (B') storing second user write data from the data input/output interface into the page buffer;
   (C') applying preferred state encoding (PSE) to the second user write data to create second PSE encoded write data and storing the second PSE encoded write data in the page buffer according to a second allocation map different from the first allocation map;
   (D') applying error correction encoding to the second PSE encoded write data to create second error correction code (ECC) encoded write data and storing the second ECC encoded write data in the page buffer according to the second allocation map; and
   (E') programming the second contents of the page buffer into the selected second page in the memory array.

6. The method of claim 5, comprising the further steps of:
   (F') storing user metadata into the page buffer; and
   (G') applying error correction encoding to at least a portion of the metadata to create ECC encoded metadata and storing the ECC encoded metadata in the page buffer.

7. The method of claim 6, wherein the NVM device is a NAND flash memory integrated circuit.

8. The method of claim 5, wherein the NVM device is a NAND flash memory integrated circuit.

9. The method of claim 4, wherein steps (C) and (D) are managed in a control circuit, and wherein the control circuit manages the further steps:
   (H) determining one of a plurality of ECC encoding methods to apply to the user write data in step (D); and
   (J) determining one of a plurality of PSE encoding methods to apply to the user write data in step (C).

10. The method of claim 9, wherein the control circuit is one of the group comprising: (i) a central processing unit, (ii) a microcontroller, (iii) a processor, (iv) a state machine, (v) a memory controller, (vi) a memory interface, and (vii) control logic.

11. A method for encoding data in a non-volatile memory (NVM) device, wherein the NVM device comprises a memory array having a plurality of pages, a page buffer coupled to the memory array, and a data input/output interface coupled to the page buffer, the method comprising the steps of:
   (A) selecting a first page in the memory array for programming;
   (B) determining a first allocation map for the first contents of the page buffer;
   (C) storing first user write data from the data input/output interface into the page buffer according to the first allocation map;
   (D) applying preferred state encoding (PSE) to the first user write data to create first PSE encoded write data and storing the first PSE encoded write data in the page buffer according to the first allocation map;
   (E) applying error correction encoding to the first PSE encoded write data to create first error correction code (ECC) encoded write data and storing the first ECC encoded write data in the page buffer according to the first allocation map; and
   (F) programming the first contents of the page buffer into the selected first page in the memory array.

12. The method of claim 11, wherein:
the NVM device comprises one of the group comprising: (i) a single integrated circuit, (ii) a plurality of integrated circuits, and (iii) a solid state drive.

13. The method of claim 12, wherein:
   (i) the single integrated circuit is a NAND flash device;
   (ii) the plurality of integrated circuits comprises a plurality of NAND flash devices; and
   (iii) the solid state drive comprises at least one NAND flash device.

14. The method of claim 11, the method comprising the further steps of:
   (G) storing metadata into the page buffer according to the first allocation map; and
   (H) applying error correction encoding to at least a portion of the metadata to create ECC encoded metadata and storing the ECC encoded metadata in the page buffer according to the first allocation map.

15. The method of claim 14, wherein:
the NVM device comprises one of the group comprising: (i) a single integrated circuit, (ii) a plurality of integrated circuits, and (iii) a solid state drive.

16. The method of claim 15, wherein:
   (i) the single integrated circuit is a NAND flash device,
   (ii) the plurality of integrated circuits comprises a plurality of NAND flash devices, and
   (iii) the solid state drive comprises at least one NAND flash device.

17. The method of claim 11, the method comprising the further steps of:
   (A') selecting a second page in the memory array for programming;
   (B') determining a second allocation map different from the first allocation map for the second contents of the page buffer;
   (C') storing second user write data from the data input/output interface into the page buffer according to the second allocation map;
   (D') applying preferred state encoding (PSE) to the second user write data to create second PSE encoded write data and storing the second PSE encoded write data in the page buffer according to the second allocation map;
   (E') applying error correction encoding to the second PSE encoded write data to create second error correction code (ECC) encoded write data and storing the second ECC encoded write data in the page buffer according to the second allocation map; and
   (F') programming the second contents of the page buffer into the selected second page in the memory array.

18. The method of claim 17, wherein:
the NVM device comprises one of the group comprising: (i) a single integrated circuit, (ii) a plurality of integrated circuits, and (iii) a solid state drive.

19. The method of claim 18, wherein:
   (i) the single integrated circuit is a NAND flash device,
   (ii) the plurality of integrated circuits comprises a plurality of NAND flash devices, and
   (iii) the solid state drive comprises at least one NAND flash device.

20. The method of claim 17, the method comprising the further steps of:
   (G') storing user metadata into the page buffer according to the first allocation map; and
   (H') applying error correction encoding to at least a portion of the metadata to create ECC encoded metadata and storing the ECC encoded metadata in the page buffer according to the second allocation map.

21. The method of claim 20, wherein:
the NVM device comprises one of the group comprising:
(i) a single integrated circuit, (ii) a plurality of integrated circuits, and (iii) a solid state drive.

22. The method of claim 21, wherein:
(i) the single integrated circuit is a NAND flash device,
(ii) the plurality of integrated circuits comprises a plurality of NAND flash devices, and
(iii) the solid state drive comprises at least one NAND flash device.

23. The method of claim 17, wherein the second PSE encoded write data has a different PSE word length than the first PSE encoded write data.

24. The method of claim 17, wherein the second ECC encoded write data is encoded using a different ECC than the first ECC encoded write data.

25. The method of claim 24, wherein the second PSE encoded write data has a different PSE word length than the first PSE encoded write data.

* * * * *